United States Patent [19]

Hultmark et al.

[11] Patent Number: 4,546,405
[45] Date of Patent: Oct. 8, 1985

[54] HEAT SINK FOR ELECTRONIC PACKAGE

[75] Inventors: Eric B. Hultmark, Wappingers Falls; Claude G. Metreaud, Fishkill; Robert A. Yacavonis, Wappingers Falls, all of N.Y.

[73] Assignee: International Business Machines Corporation, Armonk, N.Y.

[21] Appl. No.: 497,781

[22] Filed: May 25, 1983

[51] Int. Cl.[4] .............................................. H01L 23/36
[52] U.S. Cl. ...................................... 361/386; 357/81; 357/82; 165/80.3; 165/80.4; 174/16 HS
[58] Field of Search .............. 361/381, 382, 383, 384, 361/386, 388, 389; 357/81, 82; 174/16 HS; 165/80 B, 185

[56] References Cited

U.S. PATENT DOCUMENTS

| | | | |
|---|---|---|---|
| 3,030,553 | 12/1958 | Communtzis | 165/185 |
| 3,198,990 | 12/1961 | Katzin | 361/383 |
| 4,057,101 | 11/1977 | Ruka et al. | 357/82 |
| 4,277,816 | 7/1981 | Dunn | 361/384 |
| 4,296,455 | 10/1981 | Leaycraft et al. | 174/16 HS |
| 4,338,621 | 7/1982 | Braun | 357/81 |

FOREIGN PATENT DOCUMENTS

| | | | |
|---|---|---|---|
| 0054597 | 6/1982 | European Pat. Off. | 361/386 |
| 0983838 | 12/1982 | U.S.S.R. | 357/82 |

OTHER PUBLICATIONS

IBM TDB, vol. 23, No. 5, Oct. 1980, p. 1919.
Arnold et al., *Heat Sink Design for Cooling Modules in a Forced Air Environment*, Nov. 1979, IBM Corp. Technical Disclosure Bulletin, vol. 22, No. 6, pp. 2297-2298.

*Primary Examiner*—James W. Davie
*Assistant Examiner*—V. Economou
*Attorney, Agent, or Firm*—Wolmar J. Stoffel

[57] ABSTRACT

A cooling fin assembly for mounting on a semiconductor package that includes a plurality of pins adapted to be affixed to a surface on the package, and a cooling fin means having a thin walled cellular configuration with the cells defining elongated openings in side-by-side relation that extend through the fin means, the pins being seated in the cells of the fin means.

9 Claims, 3 Drawing Figures

4,546,405

HEAT SINK FOR ELECTRONIC PACKAGE

DESCRIPTION

Technical Field

This invention relates generally to heat transfer mechanisms, more particularly to heat transfer structures for electronic packaging.

The high circuit density in modern integrated circuit semiconductor devices require that the heat generated by their operation be efficiently removed in order to maintain the temperature of the devices within limits that will keep the operating parameters of the devices within predetermined ranges, and also prevent destruction of the device by overheating. The problems associated with heat removal are increased when the device is connected to the supporting substrate with solder terminals that electrically connect the device to appropriate terminals on the substrate as compared to backbonded devices where the substrate acts as a heat sink. On such solder bonded devices, the heat transfer that can be accomplished through the solder bonds is limited as compared to backbonded devices. Ordinarily the semiconductor devices are mounted in an enclosure and the devices mounted in or in contact with a heat sink. The heat sink can be cooled with liquid or air. However, when cooling requirements can be met, it is normally less expensive to dissipate the heat with a flow of air which can be chilled if desired.

As the size of the substrate supporting the operating device increases, the more significant differences in coefficient of expansion of materials of the element of semiconductor package becomes. During use, the temperature of the package is inherently cycled. Thus when the support substrate is made of ceramic, the lid or enclosure over the device is also made of ceramic with a generally similar coefficient of expansion. However, ceramic does not conduct heat as well as metal. Therefore cooling fins formed of ceramic are relatively inefficient when compared to metal and may not be suitable to meet the cooling requirements. Individual metal fins can be bonded to the ceramic to overcome the coefficient of expansion difference problem. However, the finned lid is fragile and relatively expensive because of the tedious and time consuming operation of individually bonding the fins.

An improved cooling structure for an electronic package is described in U.S. Pat. No. 4,277,816 where air is directed downwardly on the package on which is mounted hollow metal tubes with openings on the bottom end. The tubes are soldered or brazed to the lid of the package. This arrangement effectively cools the package but is relatively expensive and fragile. Application Ser. No. 489,875 commonly assigned to the assignee of this application, discloses an improved impingement cooling structure for an electronic package that is stronger and easier to build and will absorb stresses generated by temperature variations and different coefficient of expansion of the materials involved.

SUMMARY OF THE PRESENT INVENTION

It is the principal object of the present invention to provide a heat transfer mechanism for a large scale integrated circuit semiconductor package that will provide efficient heat removal and which is compatible with different materials.

Another object of the invention is to provide a heat transfer structure for an electronic module that is inexpensive, simple to assemble and will accommodate for large differential thermal expansion between the lid and the heat sink.

Yet another object of the invention is to provide a heat transfer structure for an electronic module that is light in weight, provides efficient cooling performance, and can be customized for the various types of products involved.

The foregoing and other objects and advantages are accomplished with a cooling fin assembly for mounting on a lid of an electronic semiconductor package having a substrate with at least one integrated circuit semiconductor device mounted thereon, a lid element forming with the substrate an enclosure for the semiconductor device, the improvement being a heat dissipating assembly mounted on the lid that includes a plurality of pins made of heat conductive material affixed to the lid, cooling fin means mounted on the plurality of pins where the fin means is comprised of a thin walled cellular configuration with cells defining elongated openings in side-by-side relation that extend through the fin means, the plurality of pins being seated in a plurality of the cells of the fin means.

BRIEF DESCRIPTION OF THE DRAWINGS

The details of my invention will be described in connection with the accompanying drawings in which.

BEST MODE FOR CARRYING OUT THE INVENTION

Figure 1:
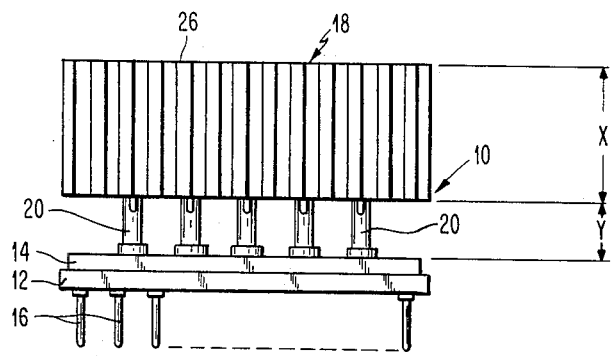
FIG. 1 is a front elevational view of an electronic package provided with the cooling fin structure of our invention.

Referring now to the figures of the drawings, there is illustrated a preferred specific embodiment of the cooling fin structure of our invention. As indicated in FIG. 1, an electronic semiconductor package 10 is illustrated having a substrate 12 with one or more integrated circuit semiconductor devices (not shown) mounted thereon, and a lid element 14 forming with substrate 12 an enclosure for the semiconductor devices. I/O pins 16 are mounted on the bottom side of substrate 12 which are in normal practice plugged into a board or card to make the necessary electrical connections to associated apparatus. The substrate can be of any suitable type to make the necessary electrical connections between the devices mounted on the top surface and the I/O pins 16. In multiple device packages the substrate will preferably have the conductive metallurgy described and shown in U.S. Pat. No. 4,245,273. Substrate 12 is normally made of a ceramic material. When the substrate 12 is of large size it is desirable that the lid 14 also be made of ceramic with a similar coefficient of expansion. When the substrate and the lid are made of the same material, both expand and contract at the same rate thereby preventing the formation of stresses during thermal cycling.

Figure 2:
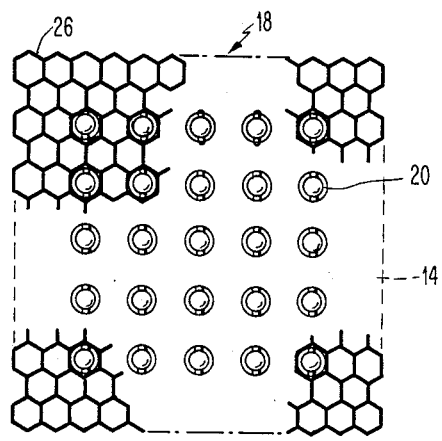
FIG. 2 is a top view in broken section of the cooling fin structure of our invention.
Figure 3:
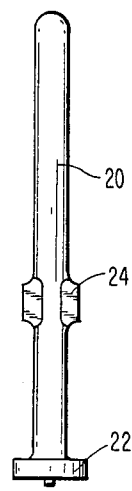
FIG. 3 is a detailed view in greatly enlarged scale illustrating the structure of a pin element of our invention used to attach to the fin structure to the module.

The invention is a new and novel heat dissipating assembly 18 that is shown mounted on the top surface of lid 14. The heat dissipating assembly 18 includes a plurality of pins 20 made of heat conductive material that are affixed to lid 14. The pins 20 are preferably made of a heat conductive material such as copper, aluminum, or the like and are provided with a head 22 that is brazed or soldered to the ceramic cover 14. In order to make the most efficient use of the cooling arrangement, the pins 20 are preferably located directly over or are clustered over devices contained on substrate 12 in the enclosure formed by lid 14. Normally a thermal conduction means is provided to more efficiently conduct heat from the device to the cover, i.e. thermal grease or a mechanical element such as described in Ser. No. 392,918 U.S. Pat. No. 4,497,140. Pins 20 preferably have cold formed shoulders 24 spaced a distance above the head 22, the purpose of which will be more apparent in the description that follows. A cooling fin structure 26 is mounted on the pins 20 as illustrated in FIGS. 1 and 2. The cooling fin is comprised of a thin walled cellular material with cells defining elongated openings in side-by-side relation that extend through the material. This material is commercially available and is relatively inexpensive. The cellular configuration forming the fins is preferably made up of a plurality of six-sided cells having the cross-sectional configuration of a regular hexagon as illustrated most clearly in FIG. 2. The fins can be formed of a material having a relatively good heat conductivity such as copper or aluminum. In assembling, the upper end of pins 20 are inserted into cells in the fin structure 26 as most clearly shown in FIG. 2. The shoulders 24 maintain the fin structure 26 at a spaced distance from the top of lid 14. The cross-section of rods 20 can be hexagonal to match the structure of the cells, or circular, in which case over-size rods are forced into the cells to displace the cell walls into a nearly circular configuration promoting high retentive forces and large contact areas. The dimensions X for the length of the honeycombed thin structure and Y for the free length above the cap are calculated for optimum cooling and flow rate. In impingement cooling, air is blown downwardly from the top through the cells of the fin structure 26. Shoulders 24 on pins 22 control the depth of insertion of the pins into the fin structure. If desired, the pins can be soldered or brazed to the fin structure 26 after the elements have been assembled. A metallurgical bond achieved by soldering or brazing will promote more efficient heat conduction from the pins to the fins.

The aforedescribed heat structure is composed of commercially available elements i.e. the honeycombed thin structure, and also the formed pin. This significantly reduces the cost of the resultant fin structure. Since the elements are relatively simple, there is no requirement for complex and expensive tooling, either to fabricate the fin structure or to assemble it. The simple fin structure invention can be tailored to different sized modules and also to accommodate different heat requirements. Also, the number and the distribution of the pins mounted on the cover can be customized for each type of product for optimum thermal performance. The pin locations can be made to match the heat source i.e. the semiconductor device, located in the package.

A very significant advantage of the structure of the invention is that it has the ability to accommodate for large differential thermal coefficients of expansion between the thin structure and the material that it is mounted on. Displacement of the pins 20 with expansion or contraction of the lid 14 is very easily and simply accommodated by the thin walled heat fin structure 26 without introducing any significant stresses. In addition, the cooling structure of the invention is relatively lightweight which will minimize stress on the package itself.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. In an electronic semiconductor package having a substrate with at least one integrated circuit semiconductor device mounted thereon, and a lid element forming with the substrate an enclosure for the said semiconductor device, the improvement comprising:
    a heat dissipating assembly mounted on said lid that includes
    a plurality of pins made of heat conductive material affixed to said lid,
    cooling fin structure mounted on said plurality of pins, said fin structure comprised of a thin walled cellular structure with of tubular cells open at both ends arranged in side by side relation,
    said cells of said thin walled cellular structure are of a honeycomb structure with each cell having an even number of sides of equal length,
    said plurality of pins seated in a plurality of said cells of said fin structure, the relationship serving as a means to mount said fin structure on said package in heat conducting relationship.

2. The semiconductor package of claim 1 wherein the lower side of said fin means is spaced from the underlying surface of said lid.

3. The semiconductor package of claim 2 wherein said pins are provided with shoulder stops spaced from the ends affixed to said lid to control the depth of insertion of said pins into said cells.

4. The semiconductor package of claim 1 wherein said fin structure is formed of aluminum.

5. The semiconductor package of claim 1 wherein said fin structure is formed of copper.

6. The semiconductor package of claim 1 wherein said pins are formed of copper.

7. The semiconductor package of claim 1 wherein said pins have enlarged heads that are bonded to said lid.

8. The semiconductor package of claim 1 wherein a plurality of semiconductor devices are mounted on said substrate and enclosed by said lid, and said pins are bonded to said lid and located over a device beneath said lid.

9. The semiconductor package of claim 1 wherein said pins have a circular cross sectional configuration with a diameter slightly larger than the width of said cells, said pins deforming the walls of said cells upon being introduced, forming a firm frictional engagement.

* * * * *